US009124132B2

(12) United States Patent
Songkakul et al.

(10) Patent No.: US 9,124,132 B2
(45) Date of Patent: Sep. 1, 2015

(54) AUTOMATED DEMAND RESPONSE GATEWAY

(75) Inventors: Pornsak Songkakul, Mequon, WI (US); Ricardo Soza, Austin, TX (US); John Patterson, Austin, TX (US); Michael Pawlowski, Bartlett, IL (US)

(73) Assignee: Siemens Industry, Inc., Alpharetta, GA (US)

(*) Notice: Subject to any disclaimer, the term of this patent is extended or adjusted under 35 U.S.C. 154(b) by 580 days.

(21) Appl. No.: 13/601,244

(22) Filed: Aug. 31, 2012

(65) Prior Publication Data

US 2014/0067150 A1 Mar. 6, 2014

(51) Int. Cl.
*G01R 21/133* (2006.01)
*G01R 22/00* (2006.01)
*G06Q 10/06* (2012.01)
*G06Q 50/06* (2012.01)
*H02J 3/14* (2006.01)

(52) U.S. Cl.
CPC .............. *H02J 3/14* (2013.01); *G01R 21/133* (2013.01); *G01R 22/00* (2013.01); *G06Q 10/06312* (2013.01); *G06Q 50/06* (2013.01); *Y02B 70/3225* (2013.01); *Y04S 20/222* (2013.01)

(58) Field of Classification Search
CPC .............. G01R 21/133; G01R 22/00; G06Q 10/06312; G06Q 50/06; Y02B 70/3225; Y04S 20/222; H02J 3/14
USPC .................. 700/286, 295, 297; 307/38, 39
See application file for complete search history.

(56) References Cited

U.S. PATENT DOCUMENTS

| | | | | |
|---|---|---|---|---|
| 4,347,576 A | * | 8/1982 | Kensinger et al. | 713/600 |
| 5,572,438 A | * | 11/1996 | Ehlers et al. | 700/295 |
| 7,010,363 B2 | * | 3/2006 | Donnelly et al. | 700/19 |
| 8,943,857 B2 | * | 2/2015 | Kappler et al. | 68/12.16 |
| 8,983,633 B2 | * | 3/2015 | Kouda et al. | 700/22 |
| 2003/0020333 A1 | | 1/2003 | Ying | |
| 2009/0048718 A1 | | 2/2009 | Richard et al. | |
| 2010/0023786 A1 | | 1/2010 | Liberman | |
| 2010/0063641 A1 | | 3/2010 | Scholten | |
| 2010/0094470 A1 | * | 4/2010 | Besore et al. | 700/282 |
| 2010/0241285 A1 | | 9/2010 | Johnson et al. | |
| 2011/0166710 A1 | | 7/2011 | Kordik et al. | |
| 2011/0172846 A1 | | 7/2011 | Kulyk et al. | |
| 2011/0218680 A1 | * | 9/2011 | Kim et al. | 700/276 |
| 2011/0258018 A1 | | 10/2011 | Tyagi et al. | |
| 2012/0016524 A1 | * | 1/2012 | Spicer et al. | 700/276 |
| 2012/0136496 A1 | | 5/2012 | Black | |
| 2012/0197458 A1 | | 8/2012 | Walter et al. | |
| 2012/0271576 A1 | * | 10/2012 | Kamel et al. | 702/62 |
| 2013/0123996 A1 | * | 5/2013 | Matos | 700/291 |
| 2014/0229016 A1 | * | 8/2014 | Shiflet | 700/276 |

OTHER PUBLICATIONS

PCT Search Report dated Dec. 11, 2013 for PCT application No. PCT/US2013/057537. (13 pages).

* cited by examiner

*Primary Examiner* — Robert Fennema
*Assistant Examiner* — Jennifer L Norton

(57) ABSTRACT

A system and method for reducing an electrical load in a facility or building with an automated demand response server having a hierarchical grouping of demand stages and demand groups with associated timers that control the shedding of load in order to achieve the appropriate level of load reduction and ramping up devices in a controlled manner upon the expiration of a demand response event.

20 Claims, 14 Drawing Sheets

← 1300

| | Demand Stage 1     1302 | |
|---|---|---|
| Parameters 1306 | Delay Time: 5 min.    1326    Duty Cycling Period: 21 min.<br>Demand Hysteresis: 15 kW    Soft Landing Time: 5 min. | 1322 / 1324 |
| Demand Group 1<br>Max Time: 15min.<br>1310 | - Turn off all outdoor water fountain pumps.   1328<br>- Turn off RTU-1, which supplies the warehouse.<br>- Turn off perimeter lights on all floors. | |
| Demand Group 2<br>Max Time: 15min.<br>1312 | - Turn off all outdoor water fountain pumps.<br>- Turn off RTU-2, which supplies the warehouse.<br>- Turn off perimeter lights on all floors.<br>- Set office room temperature set points of all non-critical areas to 78 degrees F. | |
| Demand Group 3<br>Max Time: 15min.<br>1314 | - Turn off all outdoor water fountain pumps.<br>- Turn off RTU-3, which supplies the warehouse.<br>- Turn off perimeter lights on all floors. | |

| | Demand Stage 2     1304 |
|---|---|
| Parameters 1308 | Delay Time: 5 min.     Duty Cycling Period: 21 min.<br>Demand Hysteresis: 15 kW    Soft Landing Time: 5 min. |
| Demand Group 1<br>Max Time: 15min.<br>1318 | - Turn off all outdoor water fountain pumps.<br>- Turn off RTU-1, which supplies the warehouse.<br>- Turn off perimeter lights on all floors. |
| Demand Group 2<br>Max Time: 15min.<br>1320 | - Turn off all outdoor water fountain pumps.<br>- Turn off RTU-2, which supplies the warehouse.<br>- Turn off perimeter lights on all floors.<br>- Set office room temperature set points of all non-critical areas to 78 degrees F. |

FIG. 13

AUTOMATED DEMAND RESPONSE GATEWAY

FIELD OF THE INVENTION

This application relates to the field of energy consumption management and particularly to the automated handling of demand response requests from energy providers.

BACKGROUND

Electrical energy providers, including utility companies are often in a situation where it would be advantageous to temporarily reduce demand for electrical power ("kW demand") by customers ("end users"). In particular, in times of peak demand it is advantageous to reduce overall energy consumption and therefore reduce the burden on the electrical power generators that provide power to the electrical power grid. When overall energy consumption is sufficiently reduced during times of peak demand, the electrical power grid may be stabilized such that electrical power may be reliably supplied to end users, thereby avoiding brownouts or possibly blackouts.

In order to limit energy consumption during times of peak demand, electrical utilities have traditionally increased the price for electricity during the times when it is known that electrical energy demand will be high. The hope is that the increased price for electricity during these times of high demand will cause end users to limit electrical energy consumption, and therefore avoid overloading the electrical power grid during the times of peak demand. However, electrical utilities have discovered that merely raising the price of electricity during the times of high demand is often insufficient to avoid excessive demand. Therefore, additional systems and initiatives have been developed to encourage end users to shed electrical loads during times of high demand.

Demand Response ("DR") agreements have been used by energy providers to request electrical load shedding. With DR agreements, the electric energy provider contacts certain end users during DR events that are associated with times of peak demand. In exchange for load shedding during these DR events, the end user is given certain price reductions or rebates. The DR agreements benefit the electric energy provider by reduced energy consumption during times of high demand, and also benefit the end user through energy price reductions or rebates.

Communications from the electric energy provider to the end user indicating that a DR event would occur in the near future were initially in the form of telephone calls or emails. After receiving such telephone calls or emails, the end user would take the appropriate action to reduce energy consumption under the DR agreement. For example, during a DR event in hot weather, a building operator may temporarily increase the thermostat temperature, dim the lights, increase refrigerator temperature, or take other action to reduce energy consumption during the DR event. This action typically occurred manually by an individual making the appropriate adjustments to various building control systems.

With more modern systems, DR events are typically communicated to the end user automatically over a network by computers using a client-server model. In particular, a DR server at the electric energy provider may communicate DR events to a DR client at the premises of the end user. The DR server may push data concerning the Demand Response event to the DR client, or the DR client may poll the DR server for data concerning DR events. Various protocols exist for communicating DR signals between the DR server and the DR client. One such protocol is the OpenADR (Open Automated Demand Response Communication Specification Version 1.0) protocol developed by Lawrence Berkeley National Lab and Akuacom. OpenADR has been adopted by California utilities and could become a national standard for communicating demand response signals. Under current demand response systems, when a DR client receives a DR event message providing information concerning a DR event from a DR server, the DR event message is passed on to an individual or system responsible to take corresponding load shedding actions.

While past demand response systems have been helpful in reducing energy consumption during periods of high demand, it would be advantageous to improve upon these systems. In particular, it would be advantageous to provide a Demand Response approach that is automated and efficiently reduces electrical energy consumption in a facility during various DR events based on user configured strategies with load shedding logic when responding to the DR messages.

SUMMARY

In accordance with one embodiment of the disclosure, there is provided an approach for managing the reduction of an electrical load in a facility with a building automation system. The approach includes configuration of demand response strategies that employ demand stages, demand groups and timer agents to balance the load shedding. Upon receipt of a demand reduction event message, an ADR gateway executes a load shedding approach by controlling the activation of demand groups within demand stages over one or more duty cycle periods until the DR event ends. If conflicts between devices, demand groups, or demand stages occur, rules based upon the hierarchical association of demand groups and demand stages enable conflicts to be avoided or quickly resolved. A demand hysteresis value may be subtracted to an energy reduction goal in order to assure compliance with maintaining reduced power level during a demand reduction event. Upon completion of a demand reduction event the ADR gateway controls the ramping up of the building systems such as air conditioning systems, lighting systems, and other miscellaneous electrical powered systems.

The above described approaches and advantages of the present invention, as well as others, will become more readily apparent to those of ordinary skill in the art by reference to the following detailed description and accompanying drawings. While it would be desirable to provide an automated Demand Response system that provides one or more of these or other advantageous features, the teachings disclosed herein extend to those embodiments which fall within the scope of the appended claims, regardless of whether they accomplish one or more of the above-mentioned advantages.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 13 shows demand stage tables having multiple demand groups each in accordance with an example implementation;

DESCRIPTION

Figure 1:
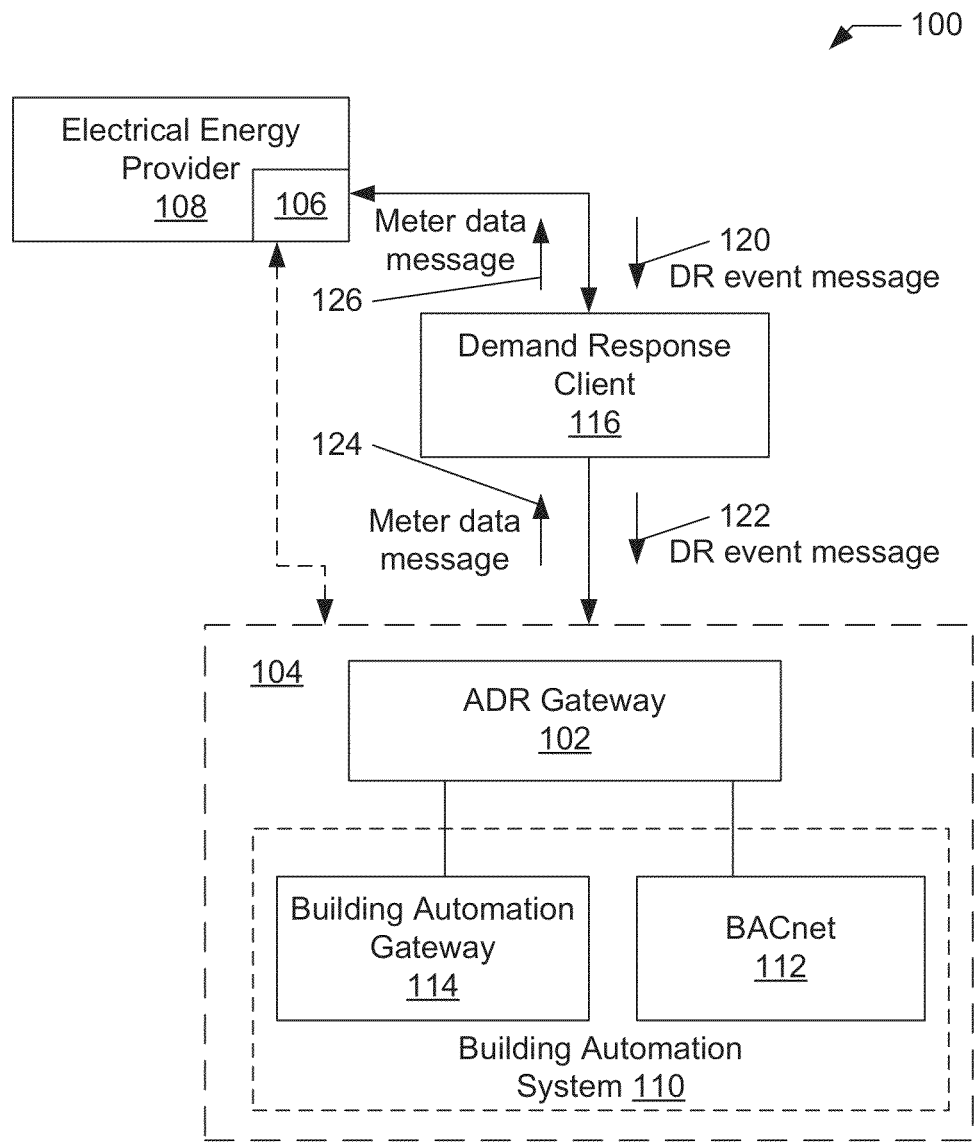
FIG. 1 shows a block diagram of an exemplary automated demand approach with an automated demand response (ADR) gateway located at an end user's site and interfaced with a building automation system.

With reference to FIG. 1, a block diagram 100 of an exemplary automated demand approach with automated demand response (ADR) gateway 102 located at an end user's site 104 is depicted. A demand response automation server computer ("DRAS" or "DR Server") 106 is typically located on the premises of an electrical energy provider, such as electrical utility 108. The DRAS 106 may communicate with the ADR gateway 102 that is typically located at an end user's site 104. The ADR gateway 102 may be coupled to a building automation system 110 that is able to control various building environment and safety devices, such as lights, thermostats in HVAC systems, refrigeration systems, meters, and alarm systems at the end user's site 104. Communication with these automation systems may occur over one or more networks, such as BACnet 112 or with other types of building automation gateways 114, such as an APOGEE gateway commercially available from Siemens Industries, Inc. Building Technologies Division. The networks may be dedicated automation systems networks or shared voice/data networks wired and/or wireless, such as 802.3 or token ring networks.

The communication between the DRAS 106 and ADR Gateway 102 may occur via a DR Client 116. The DR event message 120 may be sent from the DRAS 106 to the DR client 116. The DR client 116 may then process the message and send a DR event message 122. The DR event message 122 may contain information such as event enable status, demand stage value, target usage and DR event period. The ADR gateway 102 may receive data from meters located at the end user's site and may send the meter data to the DRAS 106 via the DR Client 116 if present. The meter data sent by the ADR gateway 102 may be raw meter data or processed meter data contained in messages 124 that are ultimately formatted and sent to the DRAS 106 in a meter date message 126 depending upon the implementation and capabilities of the DR client 116 and DRAS 106. The meter data may be used by the ADR gateway 102 to determine if additional power reduction is required and the DRAS 106 and electrical energy provider 108 to determine the effectiveness of the current DR event. The meter data that is sent back up to the DRAS 106 may also be used when calculation rebates or other compensation for end users participating in a DR event.

A demand response (DR) event may be generated by an electrical energy provider 108, by DRAS 106. For example, a DRAS 106 located at a California utility, may generate a DR event. The DR event may be sent in a message 120 to an aggregation engine DR client 116 located at an aggregator. In other implementations, the DRAS 106 may communicate with the ADR gateways directly. In yet other implementations, the DR client 116 may be combined or co-located with the ADR gateway 102. The ADR gateway 102 receives the DR event via DR event message 122 and retrieves data, such as enabled status of the DR event, target demand, and demand stage value. At the appropriate time, the ADR gateway 102 instructs the end user's automated systems to shed load and report back meter readings and/or other metrics. Examples of the ADR gateway 102 shedding load include the ADR gateway 102 instructing a building automation system to cut-back operation, turn off, raise or lower thermostat settings in a predetermined controlled manner that includes the use of timer agents.

Figure 2:
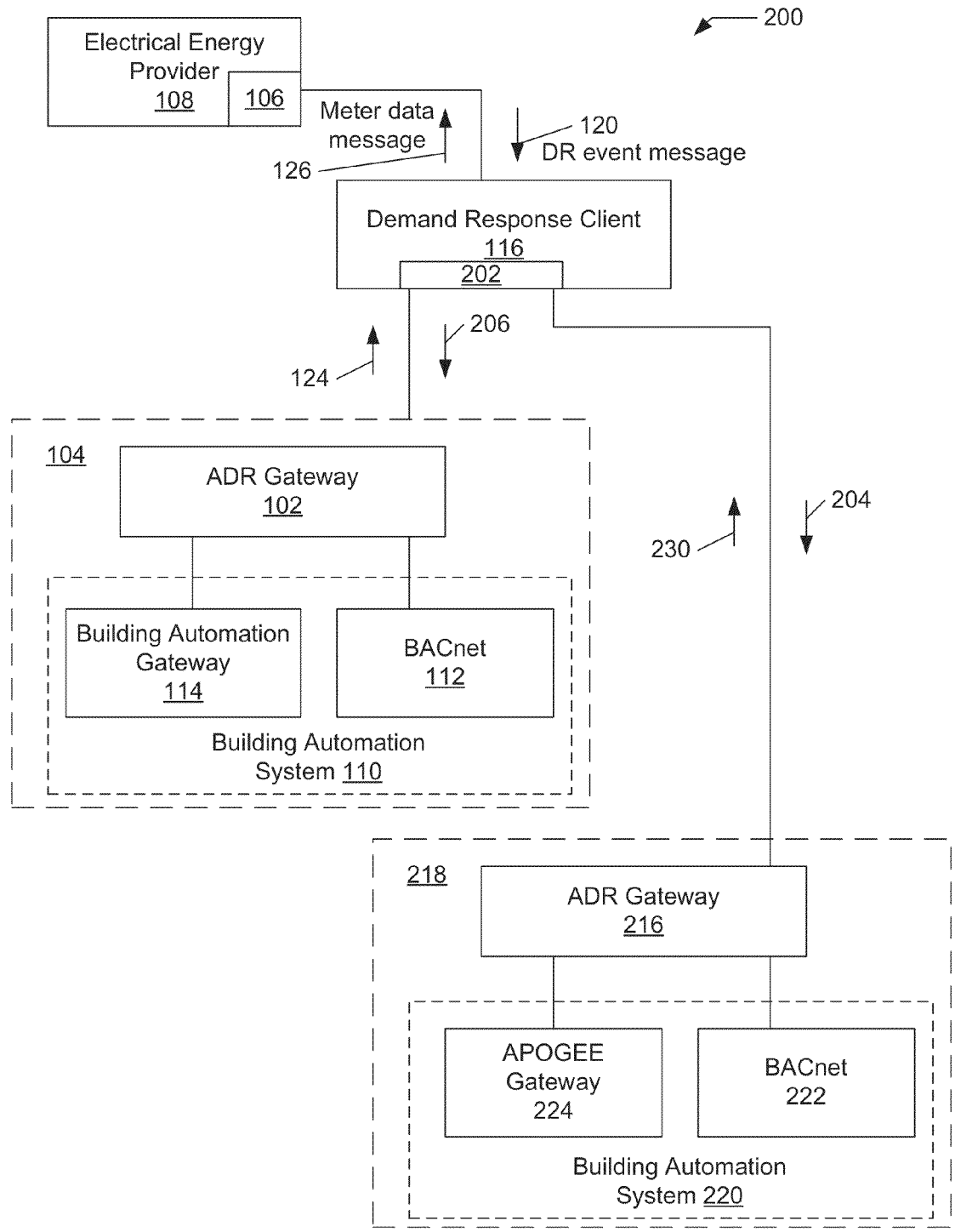
FIG. 2 shows a block diagram of an exemplary automated demand approach with automated demand response (ADR) gateways located at end users' sites.

Turning to FIG. 2, a block diagram 200 of an exemplary automated demand approach with automated demand response (ADR) gateways 102 and 216 located at end users' sites 104 and 218 is depicted. The DRAS 106 at the electrical energy provider 108 generates a DR event that may be sent to an aggregator 202 at the DR Client 116. The aggregator 202 processes the DR event and apportions the DR event between multiple customer sites. The aggregator 202 generates respective aggregate DR event messages 206 and 204 for transmission to the ADR gateways 104 and 218. In FIG. 2 only two ADR gateways 104 and 218 are depicted, but in other implementations, more than two ADR gateways may be in communication with the aggregator 202. The DR client 116 may send event messages 206 and 204 to ADR gateways 102, 216 located at end users' sites, such as 104 and 218.

Each ADR gateway, such as ADR gateways 102 and 216, which receives an aggregated DR event message, may take action to reduce the power usage at the respective end users' sites 104 and 218. Each ADR gateway 102, 216 uses their connections to networks and other controllers (112, 114, 222, and 224) to communicate with the respective building automation systems (i.e. 110 and 220) that may be instructed to shed load (reduce power consumption). Each ADR gateway 102, 216 may collect and send meter data in messages 124 and 230 to the aggregator 202 at the DR client 116. Savings and rebates in such an approach may be issued by the electrical energy provider 108 and managed by the aggregator 202 located in the DR client 116. Therefore an aggregator, such as aggregator 202 enables smaller utility customers to benefit from automated power reduction programs.

One example of an aggregator 202, is the Siemens Industry, Inc., Intelligent Load Management (ILM) services which enables customers who might not have been able to participate in automated demand reductions directly with utilities (for example, due to the size of demand reduction) to participate in the programs indirectly via the aggregator. During a DR event, the DR client 116, via the aggregator 202, may continuously monitor operating conditions and may be responsible for reporting management and capacity payment.

The aggregation engine of the aggregator 202, such as Siemens ILM services may be implemented as an application or service running on a computer or server connected to a network, such as the internet and in network communication with the DRAS 106 and ADR gateway. The aggregation engine processes the demand request and notifies the ADR gateways of the DR event. Ideally, if the DR event is to immediately occur, the ADR gateway at the end users' sites 104, 218 will start shedding load within one minute of receiving notification.

Figure 3:
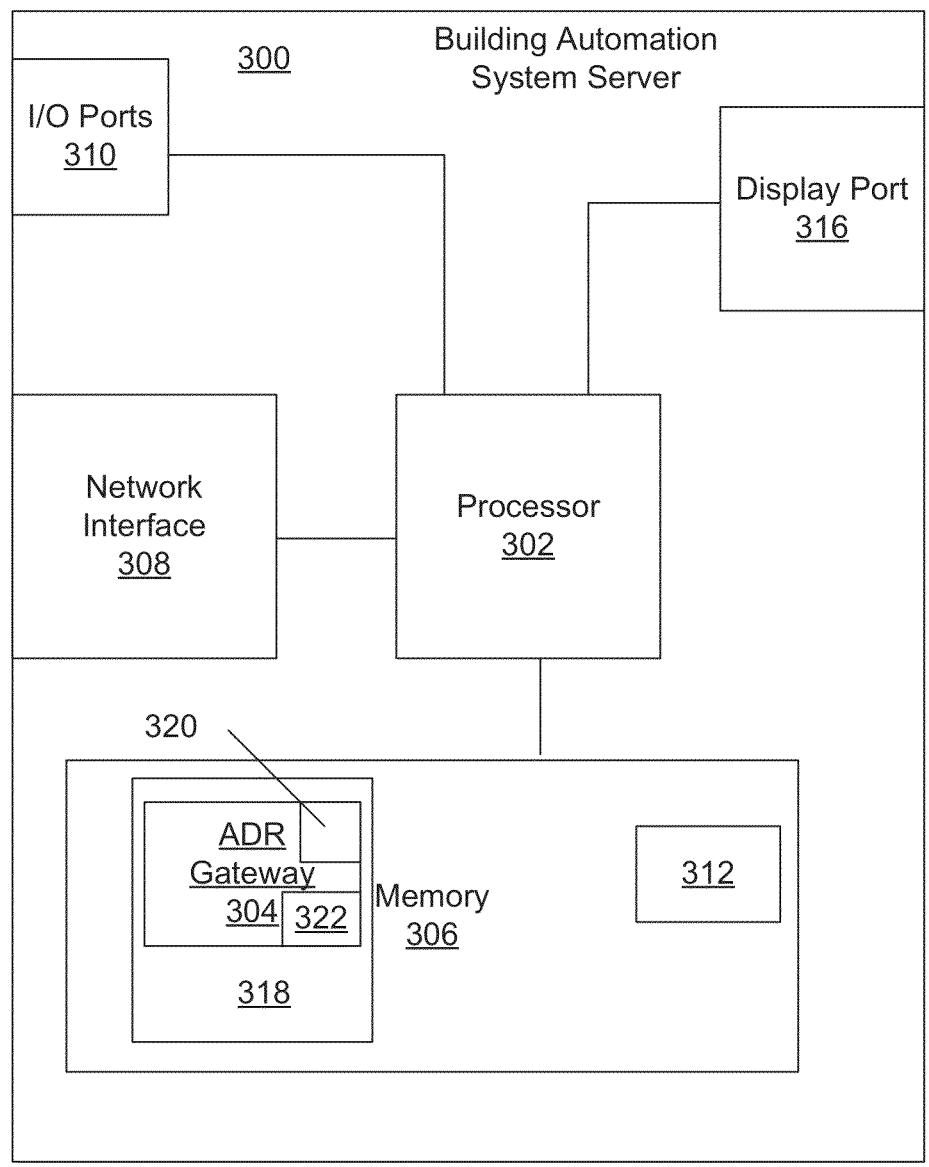
FIG. 3 shows a block diagram of a processor controlled device (such as a computer server or workstation) executing an ADR gateway task.

With reference now to FIG. 3, in one exemplary embodiment, a block diagram of a processor controlled device 300 (such as a computer server or workstation) that may be employed as BAS server executing an ADR gateway 304 task is shown. The processor controlled device 300 may execute instructions that implement an ADR Gateway, such as ADR gateways 102 and 216. The processor controlled device 300 may include a processor 302, memory 306, communications network interface 308, I/O ports 310, display port 316, and other components that may be typically present in a general purpose computer. The memory 306 may store information and programs accessible by the processor 302, including application data 318 and configuration data 312. The application data 318 and configuration data 312 may be retrieved, manipulated or stored by the processor 302. The instructions for the ADR gateway 304 task reside in a portion of memory 306 and may be executed as a background task by the processor 302 until a DR event occurs. The ADR Gateway task 304 in memory 306 may also have timer agents 320 and configuration tools and user interface instructions 322. When portions of the ADR gateway 304 task are activated or executed, the task is run at a higher priority (such as when a user interface (UI) is activated). In other implementations, the ADR gateway 304 task may be configured as a process or configured to run on dedicated hardware.

The processor 302 may be a microprocessor commonly found in desktop computers or servers, embedded controller, Application Specific Integrated Circuit ("ASIC"), Reduced Instruction Set Controller (RISC), microcontroller, digital logic circuits or even analog circuits configured to execute a state table. The memory 306 may be random access memory (RAM), combination of RAM and read only memory (ROM), magnetic memory (disk), or compact disks. Memory 306 may be fully or partially integrated with the processor 302 and includes cache memory.

Figure 4:
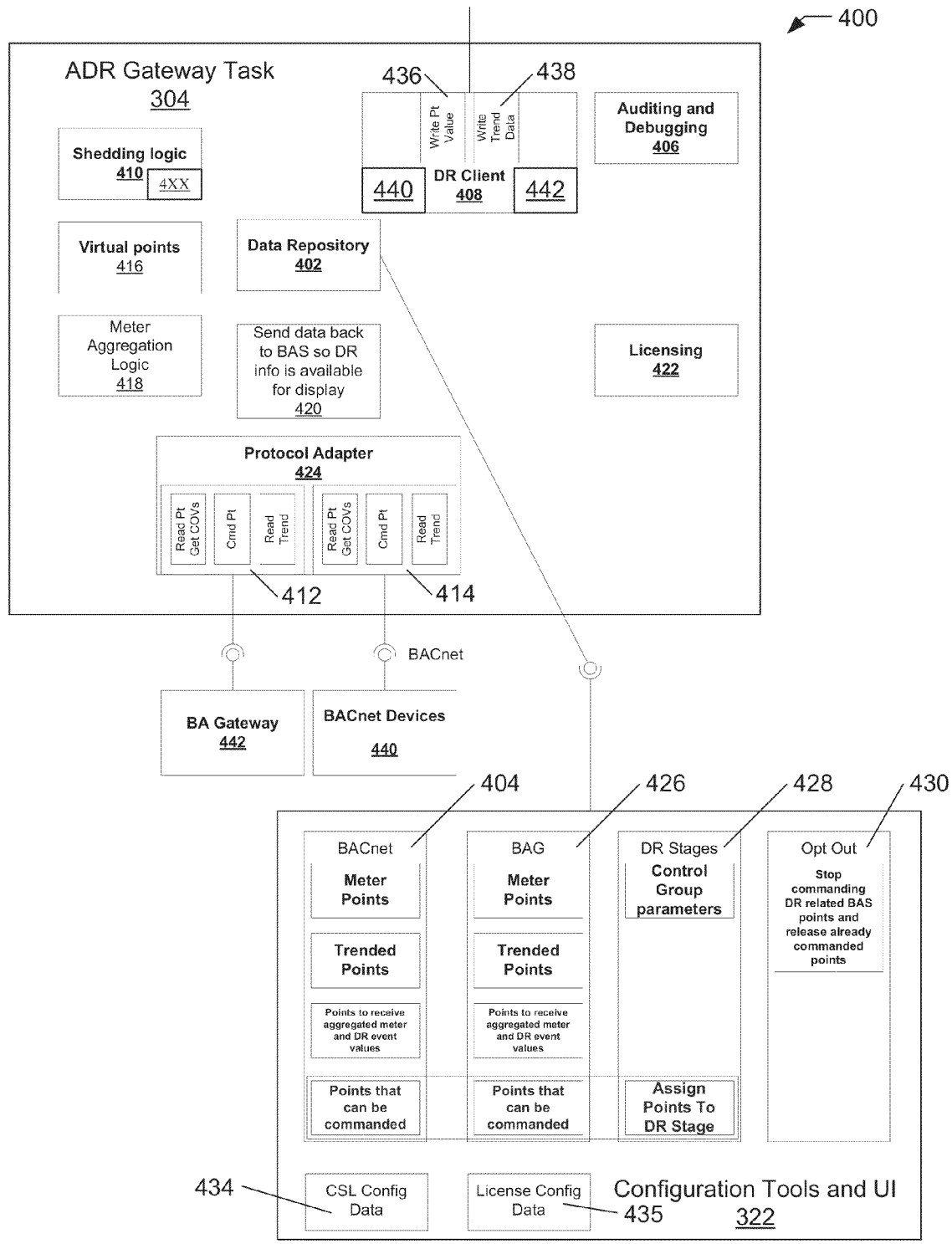
FIG. 4 shows a diagram of sub-tasks that are associated with the ADR gateway task of FIG. 3 in accordance with an example implementation.

Turning to FIG. 4, a diagram 400 of sub-tasks that are employed in the ADR gateway 304 of FIG. 3 in accordance with an example implementation is depicted. A data repository 402 stored in memory 312 of FIG. 3, may be accessible by configuration tools and user interface (UI) sub-task 322, auditing and debugging logging sub-task 406, DR client sub-task 408, shedding logic sub-task 410, virtual points sub-task 416, meter aggregation logic sub-task 418, BAS (building automation system) reporter subtask 420, licensing sub-task 422 and protocol adapter sub-task 424. Virtual points can be any control points in the APOGEE or other building automation system. The protocol adaptor sub-task may implement different protocols in order for the ADR gateway 304 to communicate with other devices in the building automation system. Examples of protocol adapters implemented by the protocol adapter 424 may include BA gateway adapter 412 using SOAP and BACnet adapter 414.

The configuration tools and user interface (UI) sub-task 322 may also access and display BACnet data 404, BA gateway data 426, DR stages 428, and Opt-out 430. Furthermore, the configuration tools and user interface (UI) sub-task 322 may also access and configure CSL configuration data 434 and license configuration data user interface 435. The configuration tools and user interface (UI) sub-task 322 may partially or fully be implemented using application frame work APIs, such as MICROSOFT.Net that runs on a MICROSOFT Windows operating system.

The license sub-task 422 verifies that the ADR gateway 304 task or application has been properly bought and/or licensed. The license code provided with the software and entered using the license configuration data user interface 435 may be validated by the license sub-task 422 via the internet or public/private key encryption. The auditing and debugging logging sub-task 406 stores history data collected by the auditing and debugging logging sub-task 406 that is made up of data such as log events generated by the other sub-tasks that aid in debugging or report operation of the ADR gateway 304. The log events may be stored by the auditing and debugging logging sub-task 406 as text in a text file located on a disk or in memory 306. In other applications, logs may print out as the events occur. The configuration tools and UI sub-task 322 enables read/write access to the data repository memory 402 and enables data to be displayed by the configuration tools and user interface (UI) sub-task 322.

The DR client sub-task 408 may implement a network service layer that is able to communicate with a network device that resides in a distributed network, such as a "cloud." The physical network layer for the network service layer may be implemented as an 802.3 internet type network. DR events may be transmitted from cloud service layer enabled device to the DR client sub-task 408. The DR client 408 may send control point data 436, such as periodic power usage data from power meters and trend data 438. The DR client sub-task may also receive and process DR command 440 and format and send meter data to the DR client 116, FIG. 1.

The ADR gateway 304 task may also communicate with other devices via a BACnet adapter sub task 414. BACnet is an open data communication protocol for building automation and control networks. It is an ASHRAE standard (135-1995) and allows building automation equipment from multiple manufactures to work as a coherent system. BACnet is an approach that controls access to the BACnet network where all BACnet enabled devices 440, such as Siemens' Insight BACnet Server, may respond to requests from the ADR Gateway 304 by transmitting data. The ADR gateway task 304 may also communicate with proprietary BA Gateway system 442 via other adapters, such as the APOGEE SOAP Adapter used to communicate with APOGEE devices.

In operation, the ADR gateway 304 task relies on grouping of curtailable load types and timer agents to shed load. Curtailable load types that are part of automation systems may include HVAC devices and other automated switches for pumps, lights, and similar devices. The ADR gateway 304 task may communicate with the automation systems via the BACnet 414 or APOGEE SOAP 412 protocol adapters. In other implementations, the ADR gateway 304 task may communicate directly with the automated switches and devices.

Figure 5:
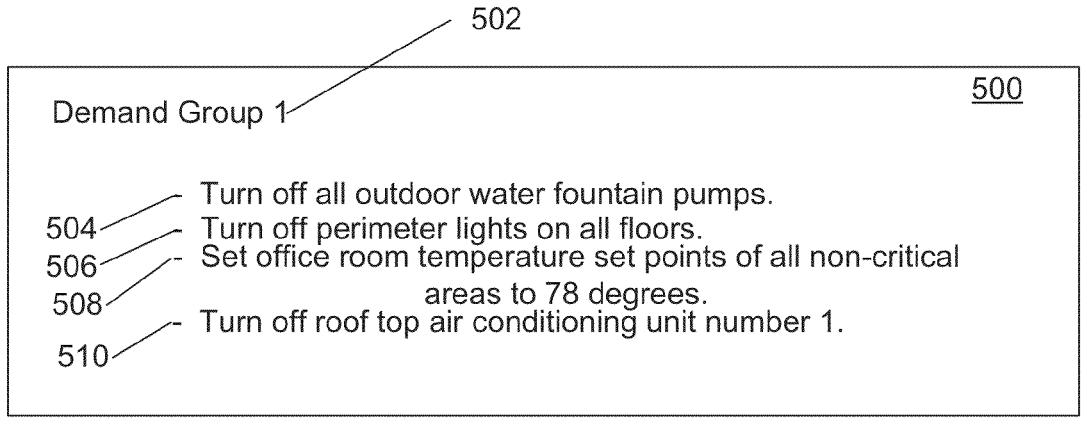
FIG. 5 shows an exemplary demand group that contains instructions for grouping of automated switches and devices in a building automation system in accordance with an example implementation.

In FIG. 5, an exemplary demand group 500 that contains a collection of control points and command values for automated switches and devices in a BAS is depicted. Control point may be referred to as a "point" and is an input or output of a field device accessible by the building automation system. A point may be physical (i.e., physical digital input/output points or physical analog input/out points) or virtual points (i.e. software points resided only in a controller). Control points associated with automated switches and devices may be used in commands grouped together in a demand group (DG). The commands when executed by the ADR gateway 304, results in instructions to shed load being sent out to control points located in an end user's building automation system. More than one demand group may be established and each demand group (DG) may be given a unique identifier, such as Demand Group 1 "DG1" 502.

FIG. 5 shows exemplary Demand Group 500 that contains instructions for grouping of automated switches and devices in a BAS. The first instruction contained in DG1 502 is an instruction that is associated with turning off all outdoor fountain pumps 504. A second instruction in DG1 502 is an instruction that is associated with turning off perimeter light fixtures on all floors 506. A third instruction in DG1 502 is an instruction that is associated with setting office room temperature at 78 degrees for all non-critical areas 508. The last instruction in DG1 502 is an instruction that is associated with turning off a roof top air conditioning unit referred to as AC unit number one 510. It is noted that the ADR gateway 304 knows of the control points associated with the perimeter light fixtures, outdoor fountain pumps, thermostats in non-critical areas, and rooftop air conditioning units.

In practice, the grouping of DGs occurs in a data structure that groups points and command values. The points may then be used by the ADR gateway 304 when communicating with automated switches and devices in the building automation system. The points associated with HVAC systems and other electrical systems may be stored in the data repository memory 402 where a user interface 322 enables entry of points and groupings of the points.

Figure 6:
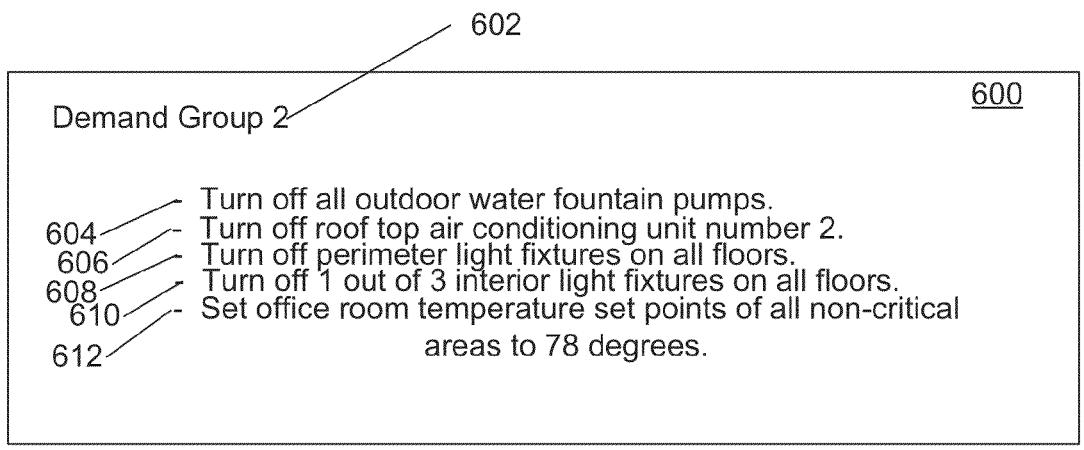
FIG. 6 shows another exemplary demand group that contains instructions for grouping of automated switches and devices in a building automation system in accordance with an example implementation.

Turning to FIG. 6, another exemplary demand group 600 that contains instructions for grouping of automated switches and devices in a BAS is depicted. The demand group (DG) is given an identifier of Demand Group 2 "DG2" 602. The first command contained in DG2 602 is an instruction that is associated with turning off all outdoor fountain pumps 604. A second command in DG2 602 is an instruction associated with turning off a roof top air conditioning unit number two 606. A third command in DG2 602 is associated with turning off perimeter light fixtures on all floors 608. A fourth command in DG2 602 is an instruction that is associated with turning off one out of three interior light fixtures on all floors 610. A fifth command in DG2 602 is an instruction that is associated with setting office room temperature at 78 degrees for all non-critical areas 612.

Figure 7:
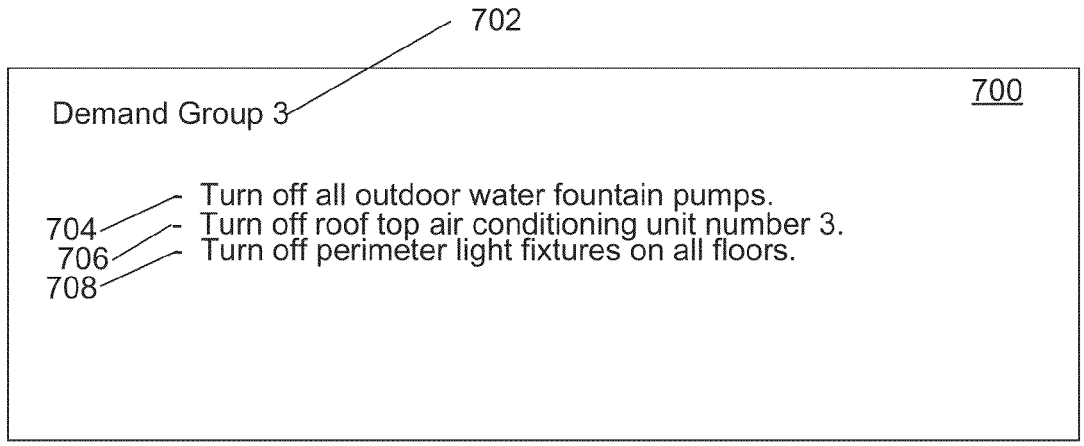
FIG. 7 shows yet another exemplary demand group that contains instructions for grouping of automated switches and devices in a building automation system in accordance with an example implementation.

Turning to FIG. 7, yet another exemplary demand group 700 that contains instructions for grouping of commands for automated switches and devices in a BAS is depicted. The demand group (DG) is given an identifier of Demand Group 3 "DG3" 702. The first command contained in DG2 702 is an instruction that is associated with turning off all outdoor fountain pumps 704. A second command in DG2 702 is a command associated with turning off a roof top air conditioning unit number three 706. A third command in DG2 702 is associated with turning off perimeter light fixtures on all floors 708.

Figure 8:
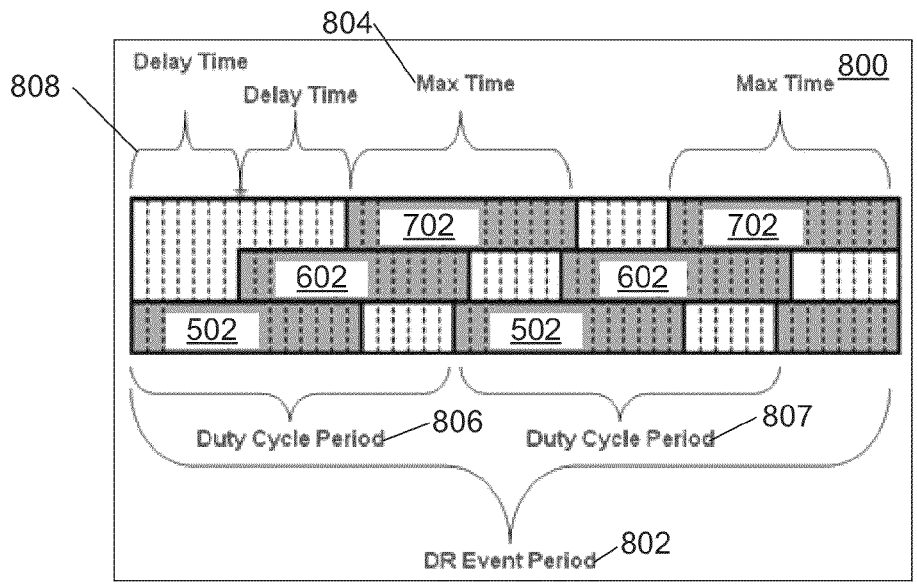
FIG. 8 depicts an example demand response (DR) event period diagram in accordance with an example implementation.
Figure 9:
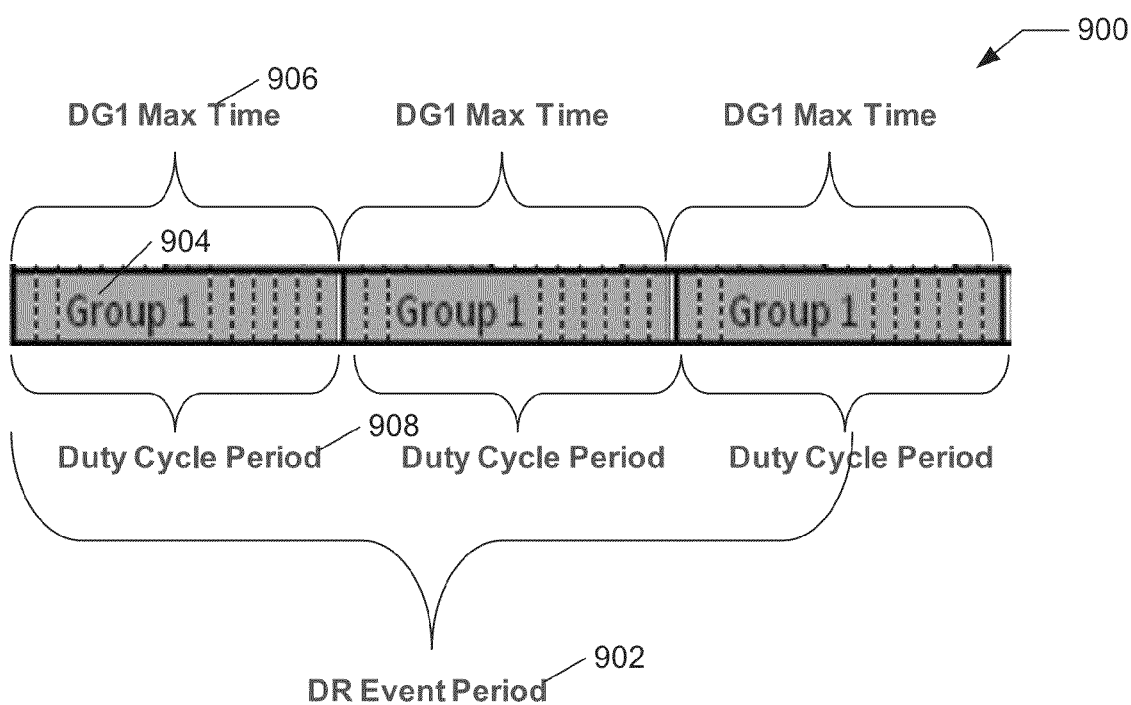
FIG. 9 is an exemplary graph of a DR event with a DR period having a single demand group in accordance with an example implementation.

When a DR event occurs and a message indicating status of the DR event, a demand stage value, a duration (DR event period) and a target demand usage is received and acted upon by the ADR gateway 304. When the DR event status is enabled, the DR event period is set to start for the duration indicated in the received DR event message. In FIG. 8, an example DR event period diagram 800 that depicts a sharing the burden approach in accordance with an example implementation is shown. When the DR event period 802 starts, the duty cycle period 806 starts and the demand group 1 502 starts. The commands contained in DG1 are executed and the points are acted upon. Thus, the ADR gateway 304 signals via a network connection, such as the BACnet adapter 414 shown in FIG. 4, to controllers that will turn off the identified fixtures (assuming those fixtures have points associated with BACnet enabled devices). A delay timer 808 is set when DG1 502 is acted upon. Upon expiration of that delay timer 808, a determination is made if an additional DG needs to be acted upon.

The power meters may communicate over a network interface, with the ADR gateway 304 via the BACnet adapter 414. If no additional power shedding is required to meet the required power consumption level, then DG2 602 is not activated. If at the expiration of the delay timer, the ADR gateway 304 determines additional power needs to be shed, DG2 is acted upon and will be activated until the max time of DG2 expires. Thus, both DG1 502 and DG2 602 may be active at the same time. Similarly, when another delay timer period expires a check is again made to see if additional power shedding is required. If so, DG3 702 may also be activated for its associated "max time" period defined for the DG3.

Each DG has an associated "max time" timer agent during which the commands in a DG act upon the points. The max time for each demand group is shown in gray on FIG. 8. i.e. "max time" for DG3 702 is 804. DG1 is active for a time period defined by its "max time" timer agent. The "max time" timers associated with each DG may be manually entered when a DG is defined. In other implementations, the "max time" may be calculated by using the "delay time" agent 808 timer and the duty cycle 806 values that have been previously entered by the end user via the UI. At the expiration of the "max time" for DG1 502, the devices and actions taken to shed load are restored, unless a device or action are still part of an active DG. For example, DG1 502 contains an action for turning off all outdoor water fountain pumps, the pumps would be turned back on upon the "max time" for DG1 expiring. But, DG2 602 and DG3 702 also have the same action of turning off all outdoor water fountains 604 and 704 respectively. Thus, if DG1 502 and DG2 602 are both active and the "max time" for DG1 804 is reached, then the fountains remain off because action 604 in DG2 602 is still active.

When the end of the duty cycle period 806 is reached and the DR event is not yet over, the new duty cycle period starts 807. When the duty cycle period starts, the demand group 1 (DG1) 502 starts again. The delay timer is set. At the expiration of the delay timer, a determination is made if additional DG is needed. If additional DG is needed, the next demand group in the hierarchy that is currently deactivated and has not yet been activated during the current duty cycle starts. The delay timer is set. Each DG is allowed to start only once during each duty cycle period. Depending on the length of the DR event period, there may be multiple duty cycle periods during the DR event. During each duty cycle period, each demand group is allowed to start only once. When the max time of each demand group is reached, the devices and actions taken to shed load for such demand group are restored. At the end of the DR event period 802, a soft landing control ramp-up method manages the deactivation of active demand groups to avoid sudden surge in electrical demand.

At the start and during the DR event period, the electrical meters may report meter data back to the ADR gateway 304. The reporting may be periodic reporting or in response to meter data requests. The meter data corresponding to electrical power usage may be compared to the meter data at the start of the DR event when determining if additional DGs need to be activated. The meter data is eventually (directly or indirectly) reported back to the electrical supplier. The electrical energy provider may use the information to determine rebates or other compensation due for participating in the DR event.

The exemplary graph 900 depicts the flexibility of the ADR gateway in organizing DS and DG for organizing load shedding control actions. In this case, a single DG1 is setup to perform load shedding control actions for the whole DR event. When a single DG (DG1 904) is specified, the "max time" timer 906 is set to equal the duty cycle period timer value 908. Thus, DG automatically starts at the start of the DR event and never stops until the end of the DR event.

Figure 10:
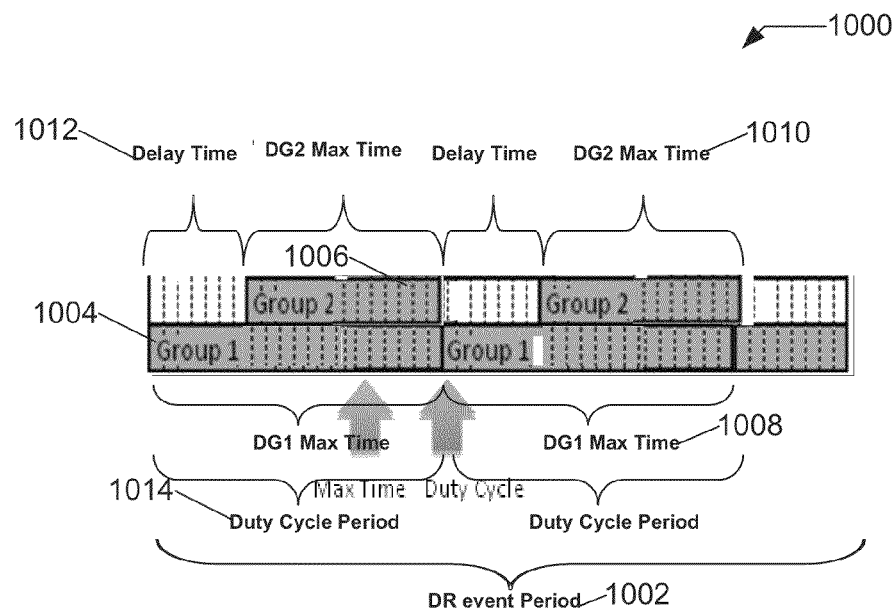
FIG. 10 is an exemplary graph of a DR event with a DR period having two DGs (DG1 and DG2) in accordance with an example implementation.

FIG. 10, the exemplary graph 1000 depicts another flexibility of the ADR gateway DS and DG in organizing load shedding control actions. In this case, two DGs (DG1 1004 and DG2 1006) are needed to perform load shedding control actions. DG1 is required to perform majority of load reduction control actions while DG2 may be required to start only when additional reduction is needed. During each duty cycle period, if the first demand group DG1 1004 is unable to shed enough load, then upon the expiration of delay timer 1012, DG2 is activated. The duty cycle results in both DG1 1004 and DG2 1006 ending at the same time. Then the duty cycle repeats with DG1 1004 being activated again and delay timer 1012 being reset and upon expiration, DG2 1006 being activated if needed.

Figure 11:
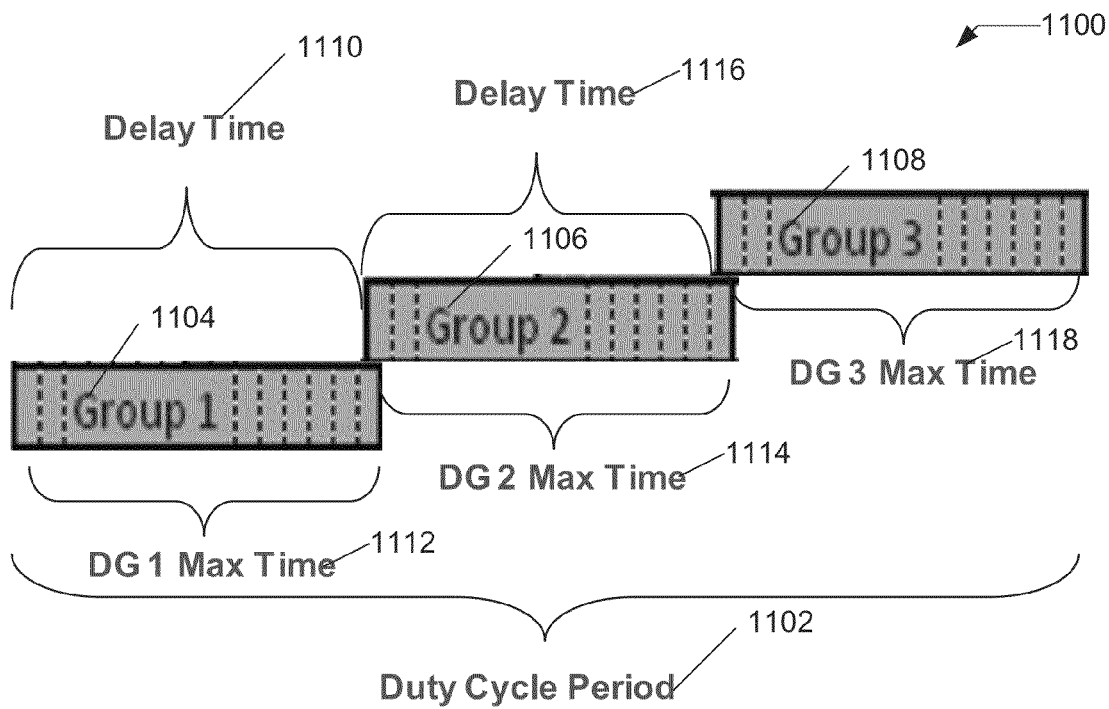
FIG. 11 is an exemplary graph of a DR event with a DR cycle period having three DGs (DG1, DG2 and DG3) in accordance with an example implementation.

FIG. 11, the exemplary graph of a DR event 1100 yet again depicts another flexibility of the ADR Gateway DS and DG in organizing load shedding control actions. In this case, three DGs (DG1 1104, DG2 1106 and DG3 1008) may be required for load reduction control actions. Each demand group consists of load shedding control actions for specific grouping of automated switches and devices. Each demand group is allowed to run only a specific amount of time. At the start of the duty cycle period 1102, DG1 1104 is activated and the delay timer 1010 is started. DG1 1104 is active for a "max time" 1112 period. Upon the delay time 1104 timer expires, DG2 1106 is activated for its "max time" 1114 period if needed and the delay time 1110 timer may be reset. Upon the delay time 1106 timer expires, DG 3 1108 is a active for a "max time"1118. The duty cycle period 1102 during each duty cycle period, all demand groups are activated in a round-robin type laddering of the demand groups (1104, 1106 and 1108). Depending on the length of the DR event period; duty cycle 1102 may be repeated several times.

Figure 12:
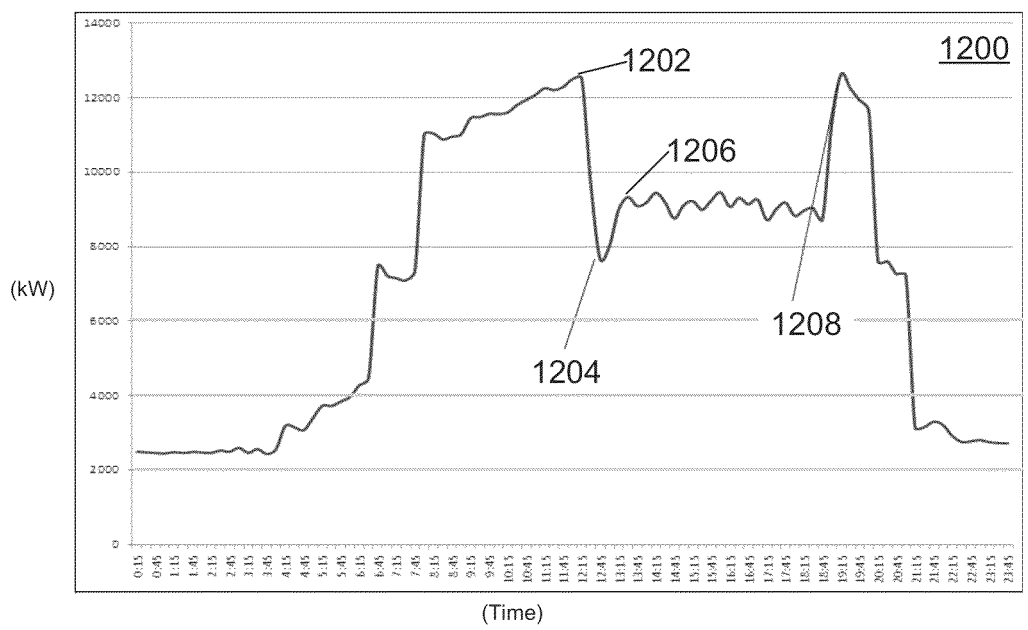
FIG. 12 an exemplary graph showing electrical demand over a DR event period in accordance with an example implementation is depicted.

Turning to FIG. 12, an exemplary graph of electrical demand during a typical DR event period is depicted. A DR event message may be received by the ADR gateway 304 which results in one or more DGs being activated to reduce the consumption of power 1202. Activation of demand groups may result in overshooting the initial power reduction goal 1204. The duty cycle period for the DGs ensures that the activation of all demand groups are happening in a predictable round-robin fashion. As the DR event progresses, there may be a rippling of power savings (see 1206) due to the duty cycle associated with each DG. Upon the end of the DR event period, a soft landing method 1208 controls the ramping up of devices.

In FIG. 13, an illustration 1300 of demand stage tables 1302, 1304, having multiple DGs each in accordance with an example implementation is depicted. A demand stage (DS) is a grouping of demand groups. Both DS one 1302 and DS two 1304 have the same parameters 1306 and 1308 in the current example. In the example of FIG. 10, a delay time 1322 has been set to five minutes, duty cycling period (duty cycle) 1324 to twenty-one minutes, demand hysteresis 1326 to fifteen kilowatts and soft landing time 1328 to five minutes. In the current example, the DS has the timer values set the same, but in other implementations the time values may be different between demand stages. These values may be set via the UI of the ADR gateway 304 in the current example. In other implementations, these values may be set via predefined default values.

In the current implementation, multiple demand stages can be configured. The first DS (DS 1) 1302 is configured with DGs 1310, 1312, 1314 that can achieve less power savings than the second DS (DS 2 1304). When a DR event occurs, the ADR gateway 304 activates the demand stage according to the demand stage value received as part of the DR event message 122. In other implementation, the activation of demand stage may be determined by the ADR gateway logic. If the power savings have not been achieved with DS 1 1302 after all DGs 1310, 1312, 1314 have been activated, then DS 2 1304 is acted upon. DS 2 1304 starts by DG1 1318 being activated. If DG1 1318 is unable to meet the power savings required by the DR event, then DG2 1320 is activated in addition to DG1 1318. If DS 2 1304 is unable to meet the power reductions request in the DR event, then a third DS may be activated if available (not shown in FIG. 10). In other implementations, the ADR gateway may determine which DS or DSs that may meet the required power reduction goal and activate that DS or combination of DSs to achieve the power reduction goal.

Figure 14:
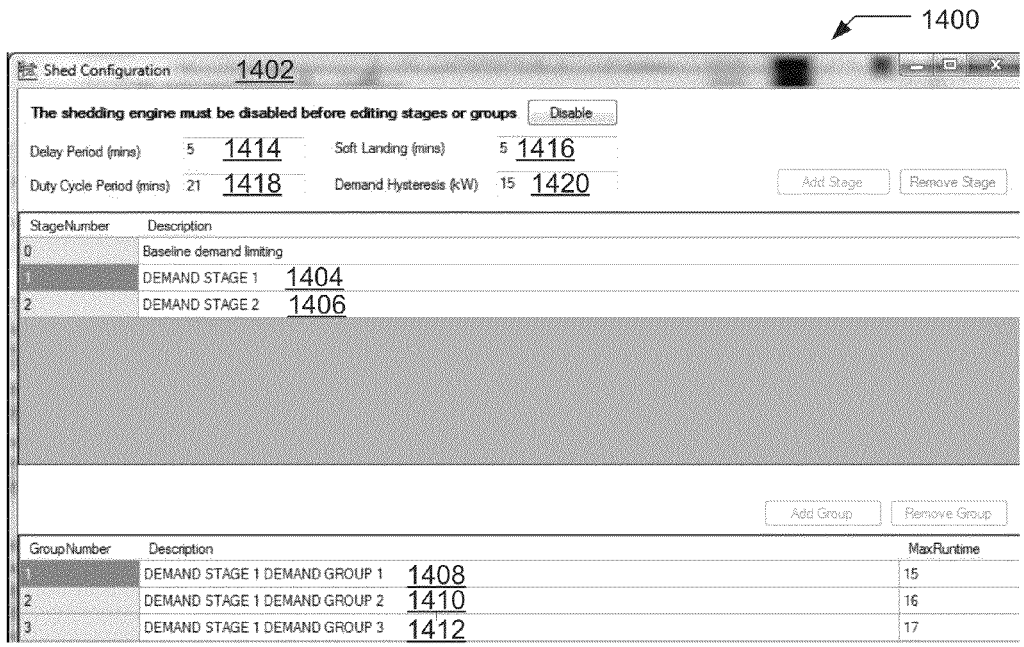
FIG. 14 shows a diagram of a window presented by the user interface (UI) of the ADR gateway of FIG. 3 in accordance with an example implementation.

Turning to FIG. 14, a diagram 1400 of a window 1402 presented by the UI of the ADR gateway 304 is depicted. The window 1402 is a "Shed Configuration" window 1402 that is used to configure DSs, such as DS 1 1404 and DS 2 1406. DS 1 1404 is highlighted in the window 1402 as an indication that DS 1 1404 is selected. The result of the selection of DS 1 1404 is a listing of the demand groups 1408, 1410, and 1412 associated with DS 1 1404. The window 1402 also allows the delay period time 1414, soft landing time 1416, duty cycle time 1418, and power demand hysteresis 1420 to be set. Further, the max runtime of each of the DSs may be set in the window 1402. Window 1402 is just an example of how the UI may hierarchically associate demand groups with demand stages while setting the different timers and hysteresis values for use by timer agents. In other implementations, different types of UIs may be employed to achieve the same or similar results.

Figure 15:
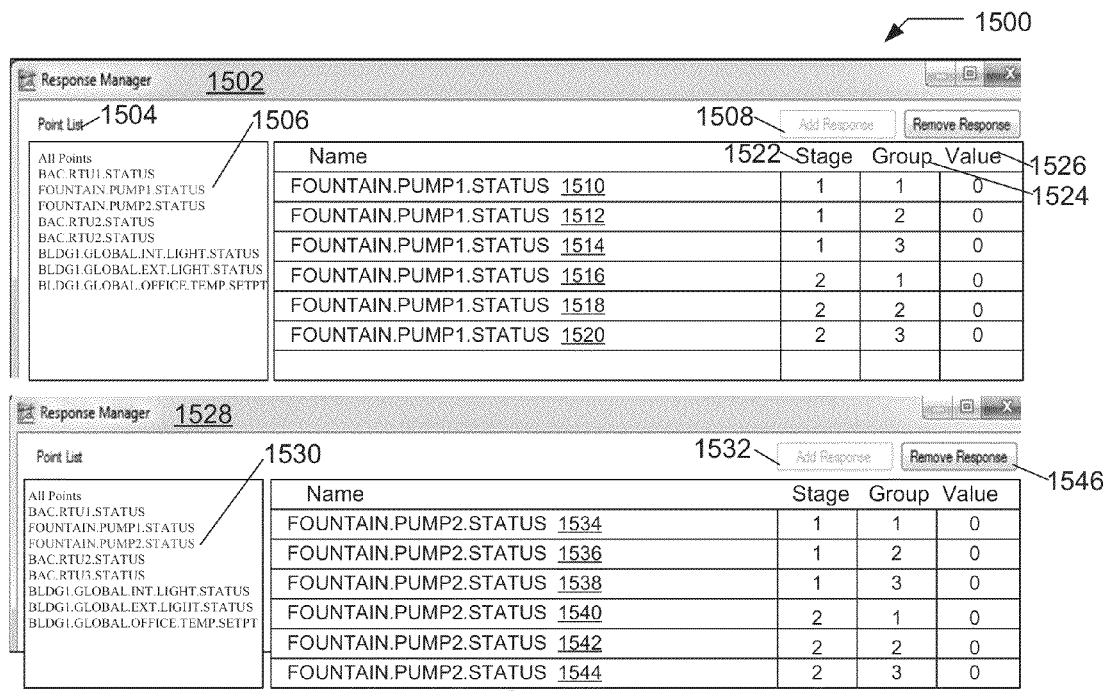
FIG. 15 shows a diagram of a response manager window presented by the UI of the ADR gateway of FIG. 3 in accordance with an example implementation.

In FIG. 15, a diagram of a response manager window 1502 presented by the UI 1500 of the ADR gateway of 304 FIG. 3 in accordance with an example implementation is depicted. The response manager window 1502 may list the control points 1504. Fountain pump1 status point 1506 is selected (shown as being highlighted) and responses 1510-1520 having been previously added using the "Add Response" button 1508. The responses 1510-1520 identify that the "fountain pump1 status" point has been assigned to a stage 1522, group 1524, and given a value 1526. The stage 1522 is a DS and group 1524 is a DG. The value is a commanded value to the point that may represent on, off, or any valid number for analog point.

Similarly, another response manager window 1528 has fountain pump2 status point 1530 selected. By selecting fountain pump2 status point 1530, responses have previously been added via the add response button 1532, such as the fountain pump2.status assigned to DS 1 and 2 and DGs 1, 2 and 3 1534-1544. Responses may be removed by highlighting the response and selecting the remove response button 1546.

The point list 1504 is generated by UI accessing point data (also referred to as control point data) that reside in a data structure, such as a linked list or array containing entries for points in the automation system that the ADR gateway 304 may communicate with. In other implementations the point data may be stored in computer registers, in a relational database as a table having a plurality of different fields and records, XML documents, or flat files. The point data may also be formatted in any computer-readable format such as, but not limited to, binary values, ASCII or Unicode.

The initial point or control point information may be manually entered in some implementations. In other implementations, point information may be read from the different device that controls the HVAC and electrical systems (lights, fountains, etc. . . . ) via network interfaces.

In other implementations, conditional checking may be executed by the ADR gateway 304 prior to shedding load. The conditional checking may be done before the ADR gateway execute load reduction control actions. The state of points specified as conditional checking point is checked first to ensure that value does not exceed acceptable conditional limit. If the state of conditional check point does not exceed acceptable limit, then, load reduction control action that are tied to the conditional checking points can be executed An example of a condition may be something like the ADR gateway can only turn off the light in the room only if the room is not occupied. Under such example, the conditional checking is whether the room is occupied or not occupied.

Figure 16:
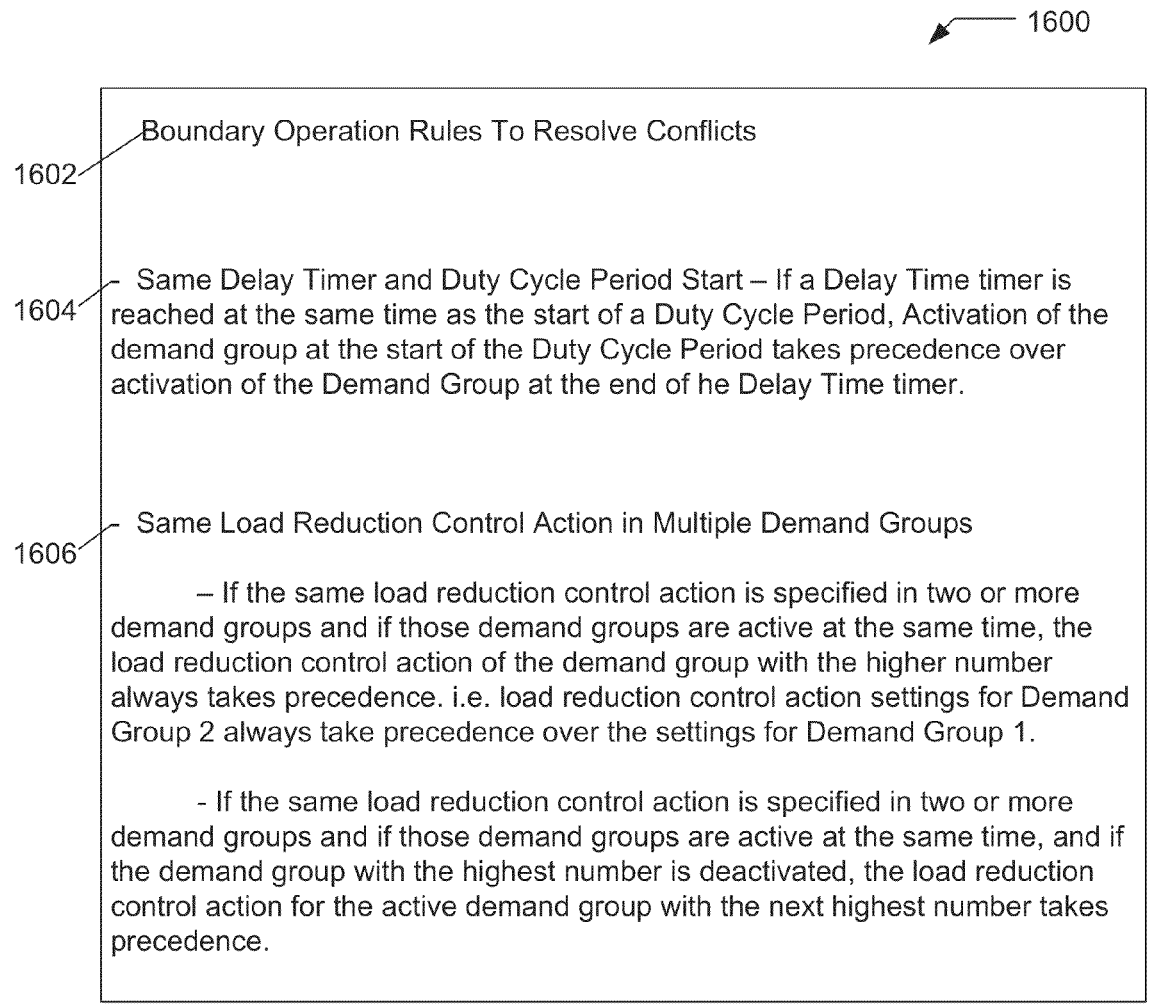
FIG. 16 shows an exemplary chart of conflict resolution rules for timer agents of the ADR gateway of FIG. 3 in accordance with an example implementation.

Turning to FIG. 16, a chart 1600 displaying examples of conflict resolution rules for timer agents of the ADR gateway 304 FIG. 3 is shown. Boundary operation rules 1602 in the current example, includes a "same delay timer and duty cycle period start" rule 1604. The "same delay timer and duty cycle period start" rule 1604 may be employed if a "delay time" timer is reached at the same time as the start of a duty cycle period. Activation of the demand group at the start of the duty cycle period will take precedence over activation of the demand group at the end of the "delay time" timer.

Another boundary operation rule 1602 in the ADR gateway 304 is a "same load reduction control action in multiple demand groups" 1606. If the same load reduction control action is specified in two or more demand groups and if those demand groups are active at the same time, the load reduction control action of the demand group with the higher number always takes precedence. For example, load reduction control action settings for DG2 always take precedence over the settings for DG1. If the same load reduction control action is specified in two or more demand groups and if those demand groups are active at the same time, and if the demand group with the highest number is deactivated, the load reduction control action for the active demand group with the next highest number takes precedence. Additional rules may be specified and implemented using a combination of rules, timer agents, and priorities (hierarchical and numerical). The boundary operation rules have been presented as a chart, but in practice the chart will be implemented as instructions derived from a high level programming language, such as C or C++. The instructions may then be executed by a processor when executing the ADR gateway 304 task.

The control systems and devices may also include other energy consuming devices that are not related to the environment within the building, such as car charging stations, phone and portable device chargers, refrigerators, ovens, televisions, computers, etc. The building automation system may also be configured to control various safety systems, such as fire alarm systems or theft deterrent systems. If the office building includes any industrial capability, the building automation system may be further configured to control the power to various industrial machines used within the building. The term "control points" may be used to refer to a particular device or system controlled by a building automation system, or to an input or output of such a device or system.

In addition to energy consuming devices, the building may also include or be associated with various energy producing devices, such as a windmill, solar panels, or a generator configured to burn fossil fuel in order to provide power to the building. If excess energy is produced by the energy producing devices, the excess energy is delivered to the electrical power grid with meter data being generated, and the electric utility compensates the building owner for the excess energy produced based upon the meter data.

The building being equipped with an ADR gateway (304 FIG. 3) that receives DR event messages from the DR client 116 that is remote from the building. In order for the owner of the building to use the ADR gateway 304 task application installed on the computer, and effectively respond to DR events, the building operator must first conduct an audit of the devices within the building and determine which devices will be part of load reduction during the DR event.

The building operator may determine to control various points using the ADR gateway 304 task differently dependent on the DR event. However, it should be recognized that the building operator may also control the various BAS points dependent on other factors, such as the time of day of the DR event, the time of year of the DR event, and the length of the DR event. For example, if a DR event occurs in the middle of the day in the summer, the building operator may choose to dim the lights to a greater degree, but keep the temperature in the building closer to a normal temperature. The reason for this is that the building will likely receive significant amounts of ambient light through the windows in the building, so lighting will be less important to the workers in the building at this time than the temperature in the building. Similarly, if the DR event is in the night in the summer, the building operator may choose to keep the lights closer to full intensity, but allow the temperature in the building to increase to a greater degree since the lighting in the building will be most important to workers at this time. Thus, even though a response strategy may only consider the DR event for purposes of simplicity in the example, it will be recognized that more complex strategies that consider other DR event factors such as time of day, season, and length of DR event, will typically be mapped out by the building operator.

Figure 17A:
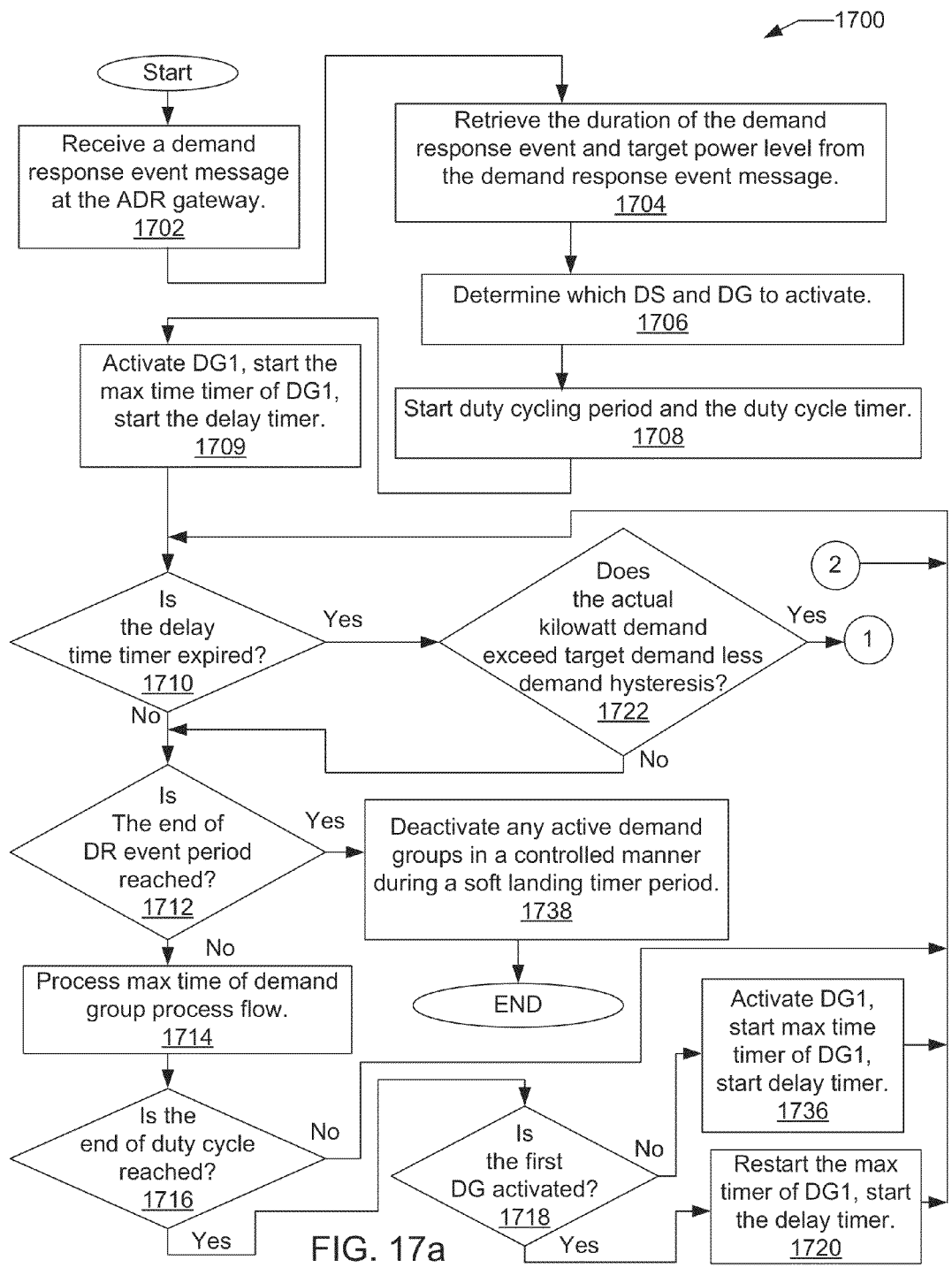
FIGS. 17a and 17b depicts a flow diagram of load shedding logic of an ADR gateway 304 in accordance with an example implementation.
Figure 17B:
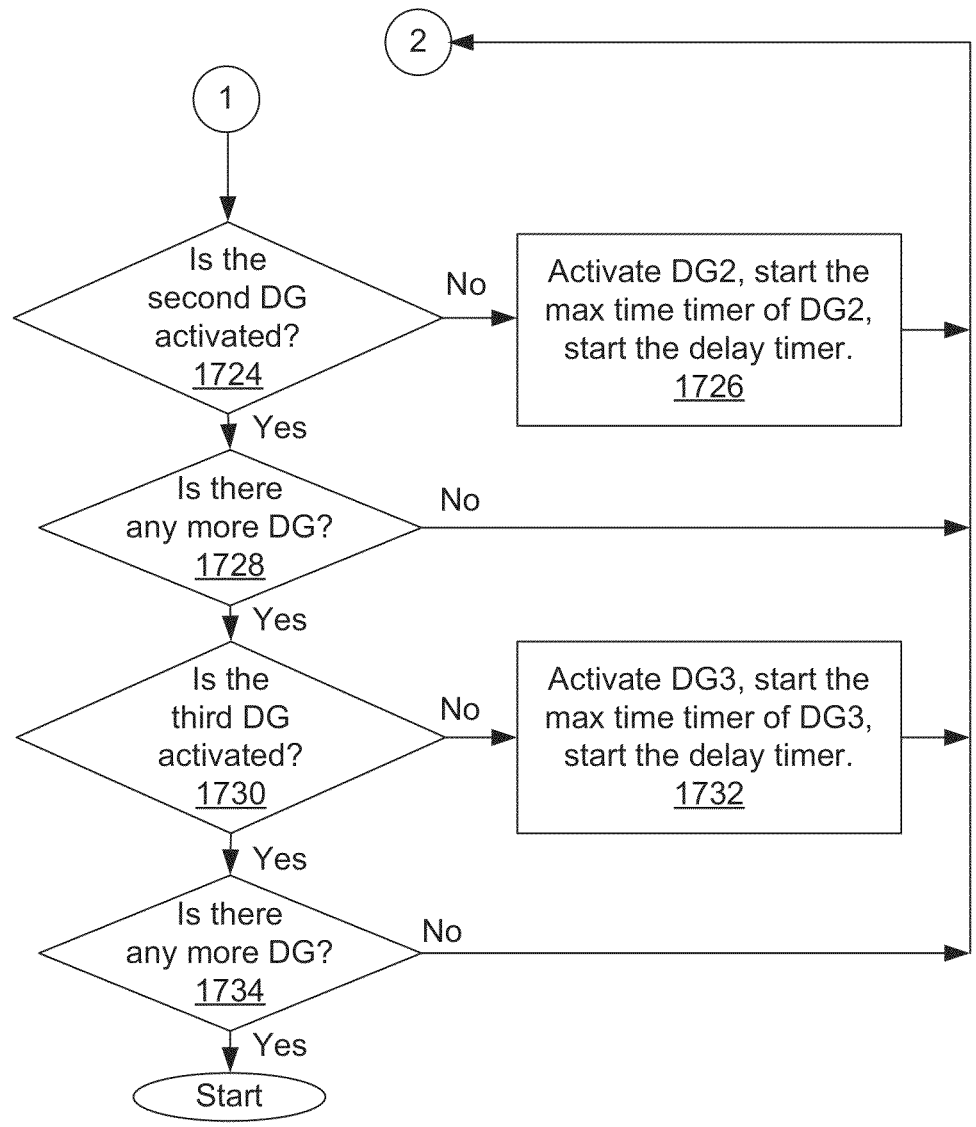

In FIGS. 17a and 17b, a flow diagram 1700 of an ADR gateway 304 approach in accordance with an example implementation is depicted. The ADR gateway 304 receives a DR event message 1702. The message is processed and the duration of the demand response event and target demand level are retrieved from the DR event message 1704. From ADR gateway 304 then determines which demand stage and demand group to activate 1706. The duty cycling period and the duty cycle timer are started 1708 and the first demand group (DG1) is started along with the delay timer 1709. If the delay time timer has not expired 1710 and the end of the DR event period is not reached 1712, then the process max time of demand group 1714 (See FIG. 18) is processed.

After the max time of demand group has been processed 1714, a determination is made if the end of a duty cycle has been reached 1716. If the first demand group is activated 1718, then the max time timer of DG1 is restarted along with the delay timer 1720. The expiration of the delay timer is again checked 1710.

If the delay time timer has expired 1710, then a check occurs to determine if the actual kilowatt demand exceeds the target demand less the demand hysteresis value 1722. If the actual kilowatt demand does not exceed target demand less the demand hysteresis 1722, then a check is made if the end of the DR event period has been reached 1712. Otherwise, a check is made if the second demand group (DG2) is activated 1724. If the second demand group is not activated 1724, then is activated and max time timer of DG2 along with the delay timer is started 1726. A check is them made again to determine if the delay time timer has expired 1710.

If it is determined that the second demand group is active 1724, then a check is made to identify if there are any other demand groups 1728. If no other demand groups are available 1728, then the delay time timer is checked again 1710. If other demand groups are available 1728, then a check is made to determine if the third demand group (DG3) is active 1730. If the third demand group is not activated 1730, then it is activated along with max time timer of DG3 and the delay timer is started 1732. Otherwise, a check is made if there are any more demand groups 1734. If there are no more demand groups then the delay time timer is checked 1710. Because the current example is only a three demand group example, the condition of having more than three demand groups will never be met. In other examples, there may be more than three demand groups. And then similar actions as steps 1730 and 1732 may be done for the additional demand groups.

If in step 1718, the first demand group is not active, then DG1 is activated and the max time timer of DG1 along with start delay timer is started 1736. After which, a check is again made to determine if the delay time timer has expired.

In step 1712, if the end of the DR event period has been reached, then active demand groups are deactivated in a controlled manner during a soft landing timer period upon expiration of the demand response event to avoid a spike in power demand 1738. The ADR gateway task 304 may then reduce its' task priority and operate in the background upon completion of the DR event and the reporting of metering data.

Figure 18:
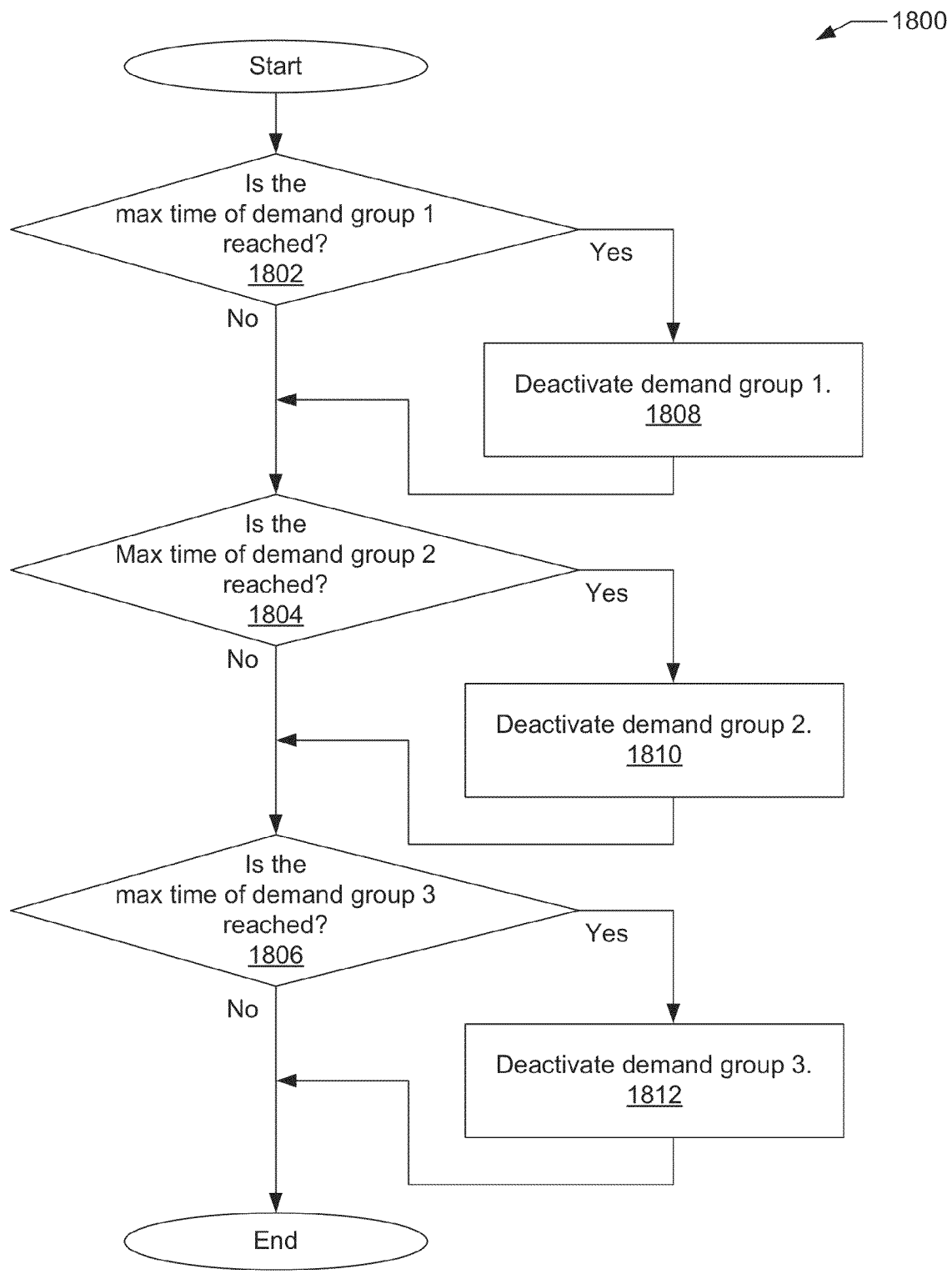
FIG. 18 depicts a flow diagram of processing the max time timers for active demand groups of FIG. 17 in accordance with an example implementation.

Turning to FIG. 18, FIG. 18 depicts a flow diagram 1800 of processing the max time timers for active demand groups 1714 of FIG. 17 in accordance with an example implementation is described. The current example has three demand groups (DG1, DG2, and DG3). In other implementations, there may be more or less demand groups used depending on the size and types of building automation systems employed. A determination is made if the max time of DG1 has been reached 1802. If the max time for DG1 has not been reached 1802, then the max time of DG2 is checked 1804. If the max time of DG2 has not reached 1804, then max time of DG3 is checked 1806. If the max time of DG3 has not been reached, then processing is complete in the current example.

If the max time of DG1 has been reached, 1802, then DG1 is deactivated 1808 and max time of DG2 is checked 1804. If the max time for DG2 has been reached 1804, then DG2 is deactivated 1810 and max time for DG 3 is checked 1806. If max time for DG3 has been reached 1806, then DG 3 is deactivated 1812 and processing is complete.

The ADR gateway 304 has been described in an example implementation as being a task executed by a processor in a computer or server. But in other implementations, the ADR gateway 304 may be implemented as a standalone device, such that the ADR gateway functionality is the only functionality of the device. Thus, the ADR gateway would be a "plug and play" network device.

It should also be recognized that the ADR gateway task 304 described herein may be configured to interface with any number of different types of automation systems, including factory automation systems, residential home automation systems, and other automation systems. Implementation of the ADR client task 304 with such differing building automation systems may be consistent with the interfaces described herein in order for the building automation system to provide the user with configurable demand response strategies and techniques for responding to DR events.

The foregoing detailed description of one or more embodiments of the automated demand response system has been presented herein by way of example only and not limitation. It will be recognized that there are advantages to certain individual features and functions described herein that may be obtained without incorporating other features and functions described herein. Moreover, it will be recognized that various alternatives, modifications, variations, or improvements of the above-disclosed embodiments and other features and functions, or alternatives thereof, may be desirably combined into many other different embodiments, systems or applications. Presently unforeseen or unanticipated alternatives, modifications, variations, or improvements therein may be subsequently made by those skilled in the art which are also intended to be encompassed by the appended claims. Therefore, the spirit and scope of any appended claims should not be limited to the description of the embodiments contained herein.

What is claimed is:

1. A method for an automated demand response (ADR) gateway that reduces an electrical load in a facility having a building automation system, the method comprising:
   receiving a demand response message associated with a demand response event via a computer connected to a network, the demand response message identifying at least a duration of a demand response event and a target power level for the demand response event;
   determining a first demand group to activate at the start of the demand response event, where more than one demand group exist;
   activating the first demand group for a maximum timer period to achieve a first power saving;
   activating a second demand group upon expiration of a delay time when the first demand group fails to meet the target power level for the demand response event; and
   further starting a duty cycle timer at a start of a duty cycle period associated with the activation of the first demand group, and resetting the duty cycle timer upon expiration and reactivating the first demand group if it has been deactivated prior to the duty cycle timer expiring.

2. The method of claim 1, further includes deactivating the first demand group upon the expiration of the maximum timer period.

3. The method of claim 1, where at least the first demand group and the second demand group are associated with a first demand stage that has a first power shedding capability that is different from a second shedding capability of a second demand stage.

4. The method of claim 3, where the second demand stage is associated with at least one additional demand group that is not present in the first demand group.

5. The method of claim 1, wherein the target power level for the demand response event is further lowered by a demand hysteresis value.

6. The method of claim 1, further comprising setting a delay timer with a user interface.

7. The method of claim 1, further comprising setting a soft landing timer that defines a soft landing period during which the first demand group and the second demand group are deactivated if active.

8. An automated demand response (ADR) gateway that reduces an electrical load in a facility having a building automation system, comprising:
 a client in a computer with a processor connected to a network in receipt of a demand response message that is associated with a demand response event, the demand response message identifying at least a duration of a demand response event and a target power level for the demand response event;
 a memory with a first demand group that is activated by the processor at a start of the demand response event, where more than one demand group exist in the memory;
 a first power reduction achieved by execution of the first demand group, where the execution occurs until expiration of a maximum time timer; and
 a second demand group in the memory that is activated by the processor upon expiration of a delay time timer when the first demand group fails to meet the target power level for the demand response event; and
 further includes a duty cycle timer that is started at a start of a duty cycle period that is associated with the activation of the first demand group, where the duty cycle timer is restarted upon expiration and the first demand group is reactivated if it has been deactivated prior to the duty cycle timer expiration.

9. The system of claim 8, wherein the first demand group is deactivated upon expiration of the maximum time timer.

10. The method of claim 8, where a first demand stage that has a first power shedding capability is associated with the at least the first demand group and the second demand group in the memory.

11. The method of claim 10, where a second power shedding capability is associated with a second demand stage having at least one additional demand group that was not in the first demand stage.

12. The method of claim 8, where a demand hysteresis value is included with the target power level for the demand response event.

13. The method of claim 8, further comprising a user interface that enables the setting of the delay time timer.

14. The method of claim 8, further comprising a user interface that enables the setting of a soft landing timer that defines the soft landing period during which any of the first demand group and second demand group that is active is deactivated.

15. A tangible, non-transitory computer readable media containing instructions, when executed by a processor result in a method for an automated demand response (ADR) gateway that reduces an electrical load in a facility having a building automation system, comprising instructions for:
 receiving a demand response message associated with a demand response event via a computer connected to a network, the demand response message identifying at least a duration of a demand response event and a target power level for the demand response event;
 determining a first demand group to activate at the start of the demand response event, where more than one demand group exists;
 activating the first demand group for a maximum time period to achieve a first power reduction;
 activating a second demand group upon expiration of a delay time when the first demand group fails to meet the target power level for the demand response event; and
 further starting a duty cycle timer at the start of a duty cycle period associated with the activation of the first demand group, and resetting the duty cycle timer upon expiration and reactivating the first demand group if it has been deactivated prior to the duty cycle timer expiring.

16. The tangible, non-transitory computer readable media of claim 15, further includes instructions for deactivating the first demand group upon expiration of the maximum time period.

17. The tangible, non-transitory computer readable media of claim 15, where at least the first demand group and the second demand group are associated with a first demand stage that has a first power shedding capability.

18. The tangible, non-transitory computer readable media of claim 17, further includes instructions for a second demand stage associated with at least one additional demand group that is not present in the first demand stage having a second power shedding capability that is greater than the first demand stage.

19. The tangible, non-transitory computer readable media of claim 15, where the instructions for the power level for the demand response event is further lowered by a demand hysteresis value.

20. The tangible, non-transitory computer readable media of claim 15, further includes instructions for setting a soft landing timer that defines a soft landing period during which the first demand group and the second demand group are deactivated if active.

* * * * *